United States Patent
Pech et al.

(10) Patent No.: US 10,876,221 B2
(45) Date of Patent: Dec. 29, 2020

(54) POLYCRYSTALLINE SILICON FRAGMENTS AND PROCESS FOR COMMINUTING POLYCRYSTALLINE SILICON RODS

(71) Applicant: Wacker Chemie AG, Munich (DE)

(72) Inventors: Reiner Pech, Neuoetting (DE); Peter Gruebl, Eichendorf (DE)

(73) Assignee: WACKER CHEMIE AG, Munich (DE)

( * ) Notice: Subject to any disclaimer, the term of this patent is extended or adjusted under 35 U.S.C. 154(b) by 1039 days.

(21) Appl. No.: 14/913,541

(22) PCT Filed: Aug. 7, 2014

(86) PCT No.: PCT/EP2014/067009
§ 371 (c)(1),
(2) Date: Feb. 22, 2016

(87) PCT Pub. No.: WO2015/024789
PCT Pub. Date: Feb. 26, 2015

(65) Prior Publication Data
US 2016/0201223 A1    Jul. 14, 2016

(30) Foreign Application Priority Data
Aug. 21, 2013 (DE) .......... 10 2013 216 557

(51) Int. Cl.
*B02C 17/20* (2006.01)
*C01B 33/021* (2006.01)
(Continued)

(52) U.S. Cl.
CPC .............. *C30B 35/007* (2013.01); *B02C 1/10* (2013.01); *B02C 2/005* (2013.01); *B02C 4/305* (2013.01);
(Continued)

(58) Field of Classification Search
CPC ......... B02C 4/305; B02C 13/28; B02C 17/20; B02C 19/00; B02C 19/056; B02C 1/10;
(Continued)

(56) References Cited

U.S. PATENT DOCUMENTS 2,029,253 A * 1/1936 Walker ................. C09K 3/1409
51/293
3,634,250 A * 1/1972 Commons, Jr. ......... C04B 30/00
156/155
(Continued)

FOREIGN PATENT DOCUMENTS

CN 101410184 A 4/2009
CN 201391632 Y 1/2010
(Continued)

OTHER PUBLICATIONS

Jahanmir, Said et al., "Maching of Ceramics and Composites," CRC Press, ISBN 9780824701789, Jan. 4, 1999.
(Continued)

*Primary Examiner* — Shelley M Self
*Assistant Examiner* — Smith Oberto Bapthelus
(74) *Attorney, Agent, or Firm* — Brooks Kushman P.C.

(57) ABSTRACT

Comminuted polysilicon with reduced contamination is prepared using multi-step comminution employing comminution with comminution tools of differing tungsten carbide content and/or grain size.

16 Claims, 2 Drawing Sheets

(51) Int. Cl.
  *B02C 1/10* (2006.01)
  *B02C 13/28* (2006.01)
  *C30B 29/06* (2006.01)
  *C01B 33/02* (2006.01)
  *C30B 15/00* (2006.01)
  *C30B 35/00* (2006.01)
  *B02C 4/30* (2006.01)
  *B02C 2/00* (2006.01)

(52) U.S. Cl.
  CPC .............. *B02C 13/28* (2013.01); *B02C 17/20* (2013.01); *C01B 33/02* (2013.01); *C01B 33/021* (2013.01); *C30B 29/06* (2013.01); *B02C 2210/02* (2013.01); *C30B 15/00* (2013.01)

(58) Field of Classification Search
  CPC ... B02C 2/005; B02C 2210/02; C01B 33/037; C01B 33/02; C01B 33/021
  USPC ...................................... 241/23, 25; 428/402
  See application file for complete search history.

(56) References Cited

U.S. PATENT DOCUMENTS

| | | | | |
|---|---|---|---|---|
| 7,270,706 | B2* | 9/2007 | Andrejewski | B02C 4/12 117/19 |
| 7,549,600 | B2* | 6/2009 | Hesse | B02C 1/10 241/24.1 |
| 7,950,600 | B2 | 5/2011 | Gruebl et al. | |
| 8,490,901 | B2* | 7/2013 | Hayashida | C30B 15/00 241/23 |
| 2002/0043130 | A1 | 4/2002 | Woo | |
| 2003/0159647 | A1* | 8/2003 | Arvidson | C30B 15/02 117/30 |
| 2007/0235574 | A1 | 10/2007 | Schaefer et al. | |
| 2009/0114748 | A1* | 5/2009 | Gruebl | B02C 4/305 241/27 |
| 2010/0001106 | A1* | 1/2010 | Schaefer | B02C 21/00 241/25 |
| 2010/0219380 | A1* | 9/2010 | Hertlein | C01B 33/035 252/500 |
| 2010/0276209 | A1* | 11/2010 | Yong | C22C 29/02 175/374 |
| 2011/0011965 | A1* | 1/2011 | Mirchandani | B22F 7/062 241/277 |
| 2011/0070439 | A1* | 3/2011 | Sofin | C01B 33/035 428/401 |
| 2011/0286906 | A1* | 11/2011 | Arvidson | C30B 15/02 423/348 |
| 2012/0052297 | A1* | 3/2012 | Pech | C01B 33/037 428/402 |
| 2012/0096821 | A1 | 4/2012 | Nemoto et al. | |
| 2012/0299212 | A1* | 11/2012 | Noda | B29C 43/222 264/175 |
| 2013/0186564 | A1* | 7/2013 | Keller | C08L 83/04 156/329 |
| 2013/0309524 | A1* | 11/2013 | Vietz | B02C 23/08 428/641 |
| 2014/0037959 | A1* | 2/2014 | Wochner | B02C 19/0056 428/402 |
| 2015/0290650 | A1* | 10/2015 | Mixon | C01B 33/021 241/18 |
| 2016/0201223 | A1* | 7/2016 | Pech | B02C 1/10 241/23 |

FOREIGN PATENT DOCUMENTS

| | | |
|---|---|---|
| EP | 1 338 682 A1 | 8/2003 |
| EP | 1 645 333 A1 | 4/2006 |
| EP | 2 695 974 A1 | 2/2014 |
| KR | 100374705 B1 | 3/2003 |
| TW | 201105603 A1 | 2/2011 |
| TW | 201144023 A1 | 12/2011 |

OTHER PUBLICATIONS

Walz, Tom, Building Superior Brazed Tools, Feb. 2008. www.carbideprocessors.com/pages/carbide-parts/tungsten-carbide-selection.html.

* cited by examiner

POLYCRYSTALLINE SILICON FRAGMENTS AND PROCESS FOR COMMINUTING POLYCRYSTALLINE SILICON RODS

CROSS REFERENCE TO RELATED APPLICATIONS

This application is the U.S. National Phase of PCT Appln. No. PCT/EP2014/067009 filed Aug. 7, 2014, which claims priority to German Application No. 10 2013 216 557.9 filed Aug. 21, 2013, the disclosures of which are incorporated in their entirety by reference herein.

BACKGROUND OF THE INVENTION

1 Field of the Invention

The invention provides polycrystalline silicon chunks and a process for comminuting polycrystalline silicon rods.

2. Description of the Related Art

On the industrial scale, crude silicon is obtained by the reduction of silicon dioxide with carbon in a light arc furnace at temperatures of about 2000° C.

This gives what is called "metallurgical grade" silicon ($Si_{mg}$) having a purity of about 98-99%.

For applications in photovoltaics and in microelectronics, the metallurgical silicon has to be purified.

For this purpose, it is reacted, for example, with gaseous hydrogen chloride at 300-350° C. in a fluidized bed reactor to give a silicon-containing gas, for example trichlorosilane. This is followed by distillation steps in order to purify the silicon-containing gas.

This high-purity silicon-containing gas then serves as a starting material for the production of high-purity polycrystalline silicon.

The polycrystalline silicon, often also called "polysilicon" for short, is typically produced by means of the Siemens process. This involves heating thin filament rods of silicon by direct passage of current in a bell jar-shaped reactor ("Siemens reactor"), and introducing a reaction gas comprising a silicon-containing component and hydrogen.

The silicon-containing component of the reaction gas is generally monosilane or a halosilane of the general composition $SiH_nX_{4-n}$, (n=0, 1, 2, 3; X=Cl, Br, I). It is preferably a chlorosilane or chlorosilane mixture, more preferably trichlorosilane. Predominantly $SiH_4$ or $SiHCl_3$ (trichlorosilane, TCS) is used in a mixture with hydrogen.

In the Siemens process, the filament rods are typically inserted vertically into electrodes present at the reactor base, through which they are connected to the power supply. Every two filament rods are coupled via a horizontal bridge (likewise composed of silicon) and form a support body for the silicon deposition. The bridge coupling produces the typical U shape of the support bodies, which are also called thin rods.

High-purity polysilicon is deposited on the heated rods and the bridge, as a result of which the rod diameter grows with time (CVD/gas phase deposition).

After the deposition has ended, these polysilicon rods are typically processed further by means of mechanical processing to give chunks of different size classes, classified, optionally subjected to a wet-chemical cleaning operation and finally packed.

The prior art discloses several processes and devices for comminution of polysilicon.

US 20070235574 A1 discloses a device for comminuting and sorting polycrystalline silicon, comprising a feed for feeding a coarse polysilicon fraction into a crushing system, the crushing system, and a sorting system for classifying the polysilicon fraction, wherein the device is provided with a controller which allows variable adjustment of at least one crushing parameter in the crushing system and/or at least one sorting parameter in the sorting system. The crusher system comprises roll crushers or jaw crushers, preferably spiked roll crushers. By means of the process, it is possible to selectively produce cubic polysilicon chunks of size 45 to 250 mm which are no longer free-flowing, reproducibly and in a high yield.

US 20100001106 A1 discloses a method for producing highly pure classified polysilicon fragments, comprising comminuting polysilicon from the Siemens method into fragments by means of a device comprising comminution tools and classifying the fragments by a screening device, and cleaning the polysilicon fragments thus obtained in a cleaning bath, wherein the comminution tools and the screening device have surfaces which contact the polysilicon and consist of a material which contaminates the polysilicon fragments only with extraneous particles that are subsequently removed selectively by the cleaning bath. The comminution is effected in a crushing system comprising a roll crusher or a jaw crusher, preferably a spiked roll crusher.

However, U.S. Pat. No. 7,270,706 B2 discloses a perforated roll having teeth spaced around the circumference of the roll, a shaft on which the roll is rotatably mounted, a housing having surfaces defining a cavity inside which the roll is mounted, an inlet port on top of the housing, an exit port on bottom of the housing, a plate inside the housing opposite the roll, where the roll, teeth, plate, and housing surfaces defining the cavity are made from or clad with a material of construction that minimizes contamination of polycrystalline silicon. The material is preferably selected from the group consisting of carbides, cermets, ceramics and combinations thereof. Particular preference is given to the use of a material selected from the group consisting of tungsten carbide, tungsten carbide with a cobalt binder, tungsten carbide with a nickel binder, titanium carbide, $Cr_3C_2$, $Cr_3C_2$ with nickel-chrome alloy binder, tantalum carbide, niobium carbide, silicon nitride, silicon carbide in a matrix such as Fe, Ni, Al, Ti, or Mg, aluminum nitride, tantalum carbide, niobium carbide, titanium carbide with cobalt and titanium carbonitride, nickel, nickel-cobalt alloy, iron, and combinations thereof.

US 20030159647 A1 discloses comminution of polysilicon by means of a jaw crusher containing tungsten carbide in a cobalt matrix (88% WC and 12% CO), where the WC core has a particle size of 0.6 μm.

U.S. Pat. No. 7,950,600 B2 discloses a roll crusher comprising a roll which rotates with a shaft, characterized in that the roll comprises a carrier roll of steel and a number of hard-metal segments, wherein the hard-metal segments consist of a cobalt matrix in which tungsten carbide is incorporated, and the hard-metal segments are reversibly fastened on the carrier roll with a form fit. The hard-metal segments consist of over 80% by weight, more preferably of more than 90% by weight, especially preferably of more than 91.5% by weight, of tungsten carbide incorporated in the cobalt matrix.

U.S. Pat. No. 7,549,600 B2 describes a crusher for producing fine silicon fragments suitable for semiconductor or solar applications from silicon fragments suitable for semiconductor or solar applications, the crusher comprising a plurality of crushing tools, the crushing tools having a surface of a hard, wear-resistant material, wherein the crusher has a comminution ratio of from 1.5 to 3, the crushing tools having a surface of hard metal, preferably tungsten carbide in a cobalt matrix, more preferably with a proportion of tungsten carbide greater than 80% by weight.

It is already known that low contamination of the polysilicon with tungsten can be achieved through a suitable process regime; see, for example, U.S. Pat. No. 7,549,600 (B2) and the examples cited therein.

There are also known process steps that follow crushing with tungsten carbide, in order to reduce contamination with tungsten; see, for example, US 20100001106 A1 or US 20120052297 A1.

Basically, it has been the assumption in the prior art and in general and specialist knowledge, that a higher hardness of the hard metal, for example through a higher W content or through a reduction in their WC grain size, results in a higher wear resistance. In the prior art, proceeding from a grain size of about 0.6 µm, rising W contents of 80% tending toward >90% W are cited; see, for example, US20030159647 A1 and U.S. Pat. No. 7,950,600 B2.

However, it has been found that harder tools also become more brittle, and there is a risk of additional unwanted contamination of the product by fractured tool material.

This problem gave rise to the objective of the invention.

SUMMARY OF THE INVENTION

The invention relates to a process for comminuting polycrystalline silicon rods into chunks by means of at least one comminuting tool having a surface comprising tungsten carbide, wherein the tool surface has a tungsten carbide content of less than or equal to 95% and the median grain size of the tungsten carbide particles—weighted by mass—is greater than or equal to 0.8 µm, or wherein the tool surface has a tungsten carbide content of greater than or equal to 80% and the median grain size of the tungsten carbide particles is less than or equal to 0.5 µm.

DETAILED DESCRIPTION OF THE PREFERRED EMBODIMENTS

Figure 1:
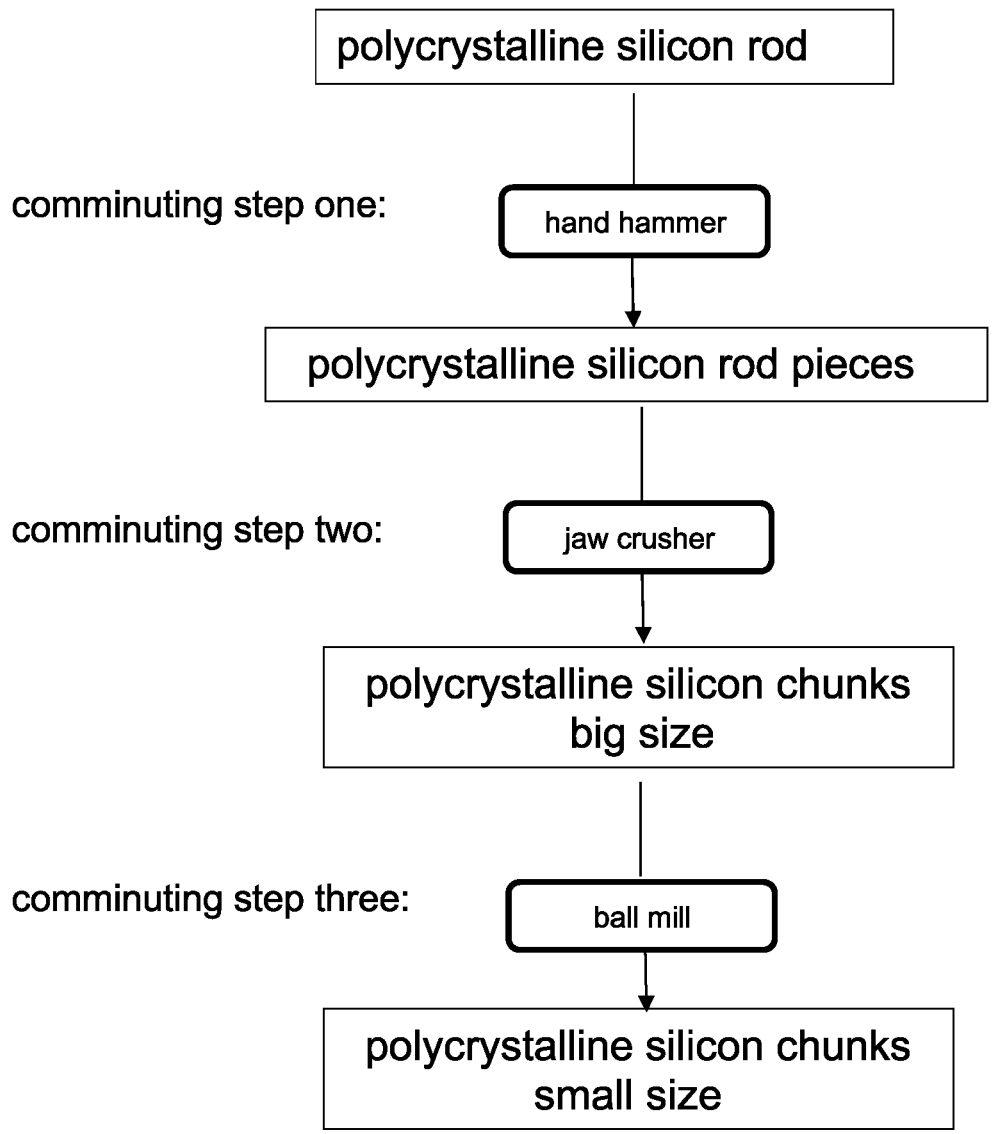
FIG. 1 is a block flowsheet illustrating one embodiment of the claimed invention which is a three-step comminution of polysilicon.

The remainder to 100% in the material of the tool surface of the process of the invention is preferably cobalt binders, which may also include up to 2%, but preferably less than 1%, of other metals.

Additional carbides are preferably present to an extent of less than 1%, of which $Cr_3C_2$ and VC are <0.4%.

The sintering outcome of the invention is also affected by addition of carbon. It is further known that a balanced carbon level is important for achieving the optimal properties of the hard metal. Inferences in this respect can be drawn, for example, via the magnetic saturation, which may be in the range of 7-14 $\mu Tm^3/kg$, or 75-110%. The carbon content based on WC is about 6%, and has a tendency to be somewhat higher.

For comminution of polycrystalline silicon rods, manual hammers, hammer mills and machine impact tools are suitable, in which case preference is given to using the coarser grains having grain size greater than or equal to 0.8 µm.

Likewise envisaged is the use of jaw and roll crushers and ball mills, in which cases preference is given to using the finer grains smaller than or equal to 0.5 µm.

The finer grains preferably have a grain size of less than or equal to 0.2 µm, in combination with a tungsten carbide content of greater than 80%, preferably greater than 90%, more preferably greater than 95%.

The coarser grains preferably have a grain size of greater than or equal to 1.3 µm, in combination with a tungsten carbide content of less than 95%, preferably less than 90%, more preferably 65-80%.

Preferably, the process comprises at least two comminution steps, the final comminution step being effected with a comminuting tool having a higher tungsten carbide content or a lower grain size of the tungsten carbide particles than in the comminuting tool used in one of the preceding comminution steps.

Preferably, the process comprises at least two comminution steps: at least one comminution step with a comminuting tool having a grain size of the tungsten carbide particles of greater than or equal to 0.8 µm, preferably greater than or equal to 1.3 µm, or at least one comminution step with a comminuting tool having a grain size of the tungsten carbide particles of less than or equal to 0.5 µm, preferably less than or equal to 0.2 µm.

Preferably, the process comprises at least two comminution steps, wherein the at least two comminuting tools used therein have different WC grain sizes, selected from the group consisting of WC grain size less than 0.5 µm, WC grain size 0.5-0.8 µm, WC grain size greater than 0.8 µm.

It is especially preferable when the process comprises at least one comminution step with a comminuting tool having a grain size of the tungsten carbide particles of greater than or equal to 0.8 µm, and a comminution step with a comminuting tool having a grain size of the tungsten carbide particles of less than or equal to 0.5 µm.

Preferably, the process comprises at least one comminution step by means of WC tools having a low WC content (<90%, preferably <85%) and/or larger grains >0.8 µm and at least one further comminution step by means of WC tools having an increasingly higher WC content (>90, preferably >95%) and/or small grains <0.5 µm.

Preferably, the last comminution step, more preferably the last two comminution steps, is/are effected with WC tools having WC content >85%, preferably >90% and/or a grain size <0.5 µm, more preferably <0.2 µm.

Preferably, the comminution of the rods, preferably the second comminution step, is followed by a thermal treatment of the chunks at a temperature of >500° C. with subsequent quenching in a colder medium, followed by further comminution steps.

It has been found that the process according to the invention for breaking polycrystalline silicon rods results in polycrystalline silicon chunks having WC particles on the surface, the WC particles having a median size of less than 0.5 µm or a median size of greater than 0.8 µm.

Preferably, the median size of the WC particles is less than 0.2 µm.

Preferably, the median size of the WC particles is greater than 1.3 µm.

It is likewise possible to obtain polycrystalline silicon chunks having WC particles on the surface thereof, the particle sizes of the WC particles on the surface being in bimodal or multimodal distribution, with at least one maximum in the distribution at less than 0.6 μm and/or at least one maximum in the distribution at greater than 0.6 μm.

Preferably, at least one maximum in the distribution is at less than 0.5 μm. More preferably, at least one maximum in the distribution is at less than 0.2 μm. Preferably, at least one maximum in the distribution is at greater than 0.8 μm. More preferably, at least one maximum in the distribution is at greater than 1.3 μm.

It has been found that, surprisingly, the tungsten carbide content, or the hardness, has a much smaller influence on the abrasion than the grain size of the WC particles of the comminuting tools, which has not been considered to date. For the same hardness, a tool having smaller grains and a smaller tungsten carbide content showed much lower abrasion than a tool having larger grains and a higher WC content.

It was also surprising that tungsten contamination on the polysilicon, given several comminution steps, is determined predominantly by the last comminution step.

This enables, in a process comprising several comminution steps, the use of less wear-resistant but tough hard metal tools in the initial comminution steps, for example in the initial breaking. This is advantageous. In the last comminution step, in contrast, it should be ensured that a tool having a particularly suitable WC type, namely having a relatively fine WC grain size and/or relatively high tungsten carbide content, is used. The inventive polycrystalline silicon chunks, which feature WC particles on the surface with defined particle sizes or particle size distributions, likewise have surprising advantages. These become visible when the polysilicon is melted and is processed further on the part of customers, for example by crystal pulling to give single crystals for solar or semiconductor applications.

The influence of the WC grain size in comminuting tools on the melting characteristics or the pulling performance in the customer's hands was unforeseeable.

In principle, WC particles on the surface of polysilicon (like other extraneous substances/metals too) can lead to dislocations in crystal pulling. For example, it is conceivable that very large WC particles are not melted because of the very high melting point of about 2800° C. and, as a result, lead to such dislocations. Smaller particles too, which are easier to melt, given the same total contamination, can lead to dislocations in single-crystal pulling because of the much higher number thereof—up to a factor of more than 1000.

However, the inventors were able to show that, with the use of WC having relatively large grains or else having relatively small grains, better results are achieved than with the grains according to the prior art, namely fine grains of ~0.6 μm; cf. US2003159647 A1.

A grain size decreasing with each breaking step is especially preferable.

The preference is especially given to initial breaking using a WC type with large grains (>0.8 μm), and a WC type with small grains (<0.5 μm) for the last breaking step(s).

More particularly, however, it is possible to achieve better results through the combination of a plurality of comminution steps with tools of various grain sizes, namely lower contamination, higher service lives and better pulling performance. The dimensions of the processing tools can be increased, and hence processes can be run with higher throughput and lower costs.

In addition, no complex reprocessing of the chunks is required, for example through a wet-chemical cleaning operation. Overall, the production process becomes much more economically viable.

FIG. 1 shows one embodiment of the process described herein, in which a three stage comminution of polysilicon is effected. FIG. 1 also applies, for example, to a two-stage comminution where, for instance, either the first stage or the last stage shown in FIG. 1 is deleted.

Figure 2:
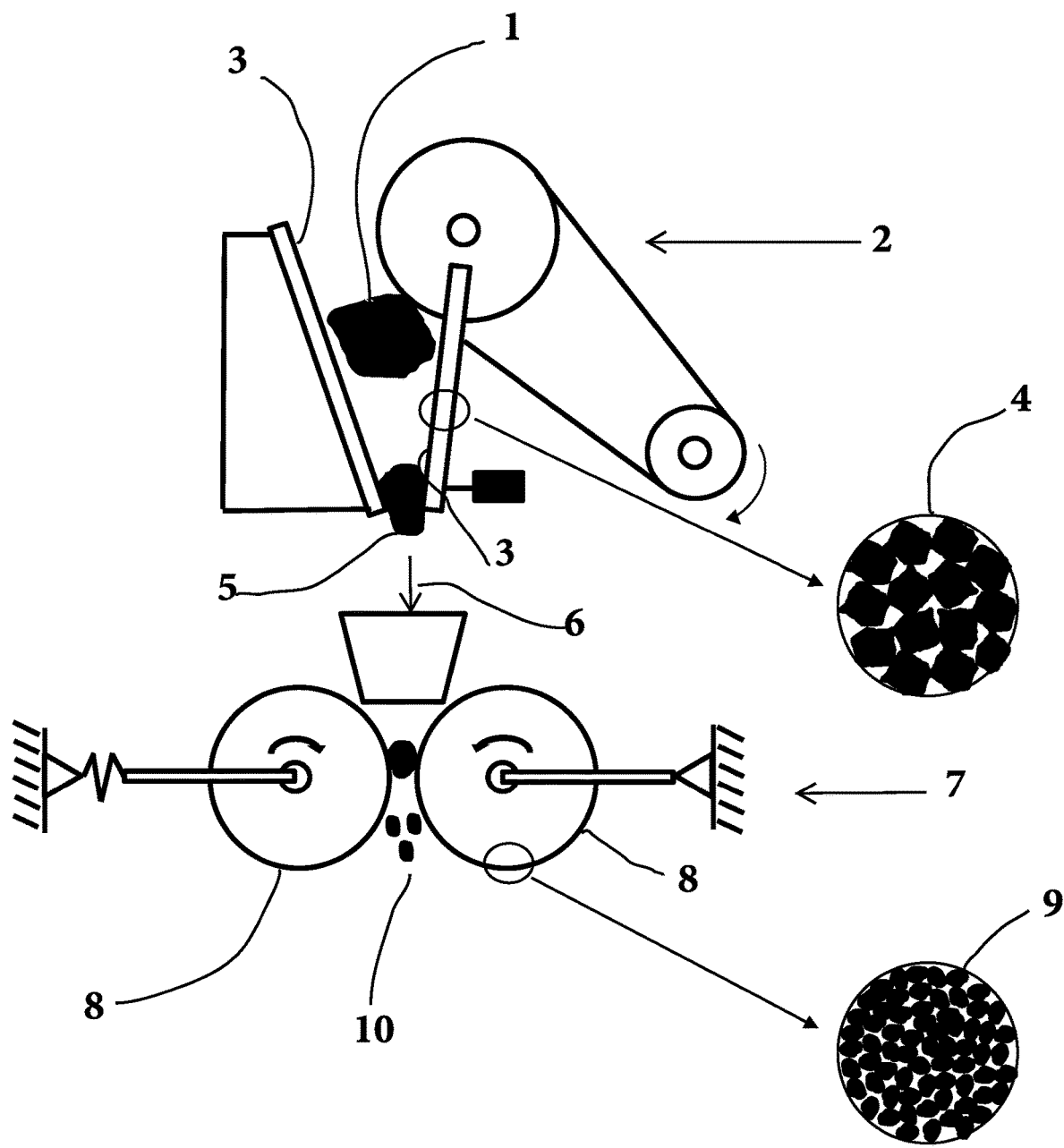
FIG. 2 illustrates one embodiment of the present invention where a jaw crusher having faces of coarse-grained silicon carbide is followed by a roll crusher having roll faces of fine-grained silicon carbide.

FIG. 2 illustrates one embodiment of the invention where coarse polysilicon chunks 1 are crushed between the jaws 3 of jaw crusher 2. The jaws 3 are faced with a facing material containing coarse grained silicon carbide 4. The smaller, comminuted chunks 5 fall as indicated by arrow 6 into roll crusher 7 in which the rolls 8 are faced with a facing material containing small grained silicon carbide 9 to comminute the polycrystalline silicon into smaller chunks 10.

EXAMPLES

Comminution into chunks results in chunk sizes (CS), which can be assigned to the following size classes, each of which is defined as the longest distance between two points on the surface of a silicon chunk (=max. length):
Chunk size 0 [mm] 1 to 5;
Chunk size 1 [mm] 4 to 15;
Chunk size 2 [mm] 10 to 40;
Chunk size 3 [mm] 20 to 60;
Chunk size 4 [mm] 45 to 120;
Chunk size 5 [mm] 90 to 200
Chunk size 6 [mm] 130 to 400

Example 1

Manual breaking of polycrystalline silicon rods with a manual hammer (WC in Co matrix)
a. (prior art) 88% WC, 12% Co and fine grains (0.5-0.8 μm): small, visible WC splinters, i.e. high contamination
b. 88% WC, 12% Co and coarse grains (2.5-6.0 μm): no visible WC splinters, i.e. low contamination
c. 80% WC, 20% Co and fine grains (0.5-0.8 μm): no visible WC splinters Example 2

Initial breaking as in example 1 b. and further breaking with a roll crusher to target size CS4, classification and analysis of the surface contamination of sample pieces of a component fraction according to the prior art with ICPMS (ICP=inductively coupled plasma) to DIN 51086-2; hardness figures according to Vickers, test force 10 kp).
a. (prior art) hardness HV10 1650: 90% WC+10% Co, very fine grains (0.5 μm to 0.8 μm): CS1 tungsten 2000 pptw
b. hardness HV10 1630: 94% WC+6% Co, fine grains (0.8 μm to 1.3 μm): CS1 tungsten 4000 pptw
c. hardness HV10 1590: 85% WC+15% Co; ultrafine grains (0.2-0.5 μm): CS1 tungsten 1000 pptw Example 3

Manual initial breaking according to example 1 b., then further breaking to target size CS2 with large jaw crusher (88% WC & 12% Co and very fine grains (0.5-0.8 μm)), then two breaking steps with a smaller jaw crusher (88% WC & 12% Co very fine grains (0.5 μm to 0.8 μm)) and a last breaking step a. with jaw crusher (88% WC & 12% Co very fine grains (0.5 µm to 0.8 µm): CS2 tungsten 500 pptw (prior art), or b. with jaw crusher (93.5% WC & 6.5% Co ultrafine grains (0.2 µm to 0.5 µm): CS2 tungsten 200 pptw (a. and b. each at about the same comminution ratio)

Example 4

As example 3 b., but with thermal 800°/1 h pretreatment and subsequent quenching in water at 20° and vacuum drying after the second breaking step.

Result: CS2 tungsten 50 pptw

Example 5

Poly-Si rods are broken in a controlled manner with several breaking steps and different WC types to CS2, such that the end product of the comparison groups each has about the same W contamination of about 500 pptw, but each group differs by the grain size on the product.

Subsequently, the material was pulled to a single crystal by the CZ process and the dislocation-free length was measured.

The mean dislocation-free length is determined from the ratio of a possible cylindrical crystal rod length (calculated from starting weight minus cone and residual melt losses) and actual length of several crystals.

a. (prior art) manual initial breaking (88% WC/12% Co/very fine grains 0.5-0.8 µm) to CS4, followed by two breaking steps with a jaw crusher (88% WC/12% Co/grains 0.5-0.8 µm) to CS2:

dislocation-free length ~70% b. manual initial breaking (88% WC/12% Co/coarse grains 2.5-6.0 µm) to CS4, three breaking steps with a jaw crusher (88% WC/12% Co/coarse grains 2.5-6.0 µm) to CS2:

dislocation-free length ~95% c. manual initial breaking (88% WC/12% Co/ultrafine grains 0.2-0.5 µm) to CS4, one breaking step with a jaw crusher (88% WC/12% Co/ultrafine grains 0.2-0.5 µm) to CS2:

dislocation-free length ~93%

The invention claimed is:

1. A multiple step process for comminuting polycrystalline silicon rods or portions thereof with a plurality of comminuting tools having comminuting surface(s) comprising silicon carbide, the process comprising at least the following steps:

a) comminuting with a first comminuting tool whose comminuting surface(s) contain coarse tungsten carbide particles having a median weight grain size of ≥1.3 µm, in an amount of ≤95 wt. % dispersed in a metal matrix; and b) subsequent to step a) further comminuting with a second comminuting tool whose comminuting surface(s) contain fine tungsten carbide particles having a median weight grain size of ≤0.5 µm, in an amount of ≥80 wt. % dispersed in a metal matrix.

2. The process of claim 1, wherein the process further comprises at least one further step of comminuting with a comminuting tool whose comminuting surface(s) contain coarse tungsten carbide particles having a median weight grain size of ≥1.3 µm, in an amount of ≤95 wt. % dispersed in a metal matrix, prior to step b).

3. The process of claim 2, wherein the process comprises at least one further step of comminuting with a further comminuting tool whose comminuting surface(s) contain fine tungsten carbide particles having a median weight grain size of ≤0.5 µm, in an amount of ≥80 wt. % dispersed in a metal matrix, after a previous step of comminuting with a second comminuting tool whose comminuting surface(s) contain fine tungsten carbide particles having a median weight grain size of ≤0.5 µm, in an amount of ≥80 wt. % dispersed in a metal matrix.

4. The process of claim 1, wherein the process further comprises at least one further step of comminuting with a further comminuting tool whose comminuting surface(s) contain fine tungsten carbide particles having a median weight grain size of ≤0.5 µm, in an amount of ≥80 wt. % dispersed in a metal matrix, after a previous step of comminuting with a second comminuting tool whose comminuting surface(s) contain fine tungsten carbide particles having a median weight grain size of ≤0.5 µm, in an amount of ≥80 wt. % dispersed in a metal matrix.

5. The process of claim 1, wherein the median weight grain size of the second comminuting tool is ≤0.2 µm.

6. The process of claim 1, wherein the first comminuting tool is a manual hammer, a hammer mill, or a machine impact tool.

7. The process of claim 6, wherein the second comminuting tool is a jaw crusher, a roll crusher having two rolls, or a ball mill.

8. The process of claim 1, wherein the second comminuting tool is a jaw crusher, a roll crusher having two rolls, or a ball mill.

9. The process of claim 1, wherein the metal matrix of the first comminuting tool or the secondary comminuting tool comprises cobalt.

10. The process of claim 1, wherein the grain size of the tungsten carbide particles in the second comminuting tool surface is less than or equal to 0.2 µm and the tungsten carbide content is greater than 90%.

11. The process of claim 1, wherein the grain size of the tungsten carbide particles in the second comminuting tool surface is less than or equal to 0.2 µm and the tungsten carbide content is greater than 95%.

12. The process of claim 1, wherein the metal matrix of all comminuting tool surface(s) comprises cobalt.

13. The process of claim 1, wherein the tungsten carbide content of the first comminuting tool surface is less than 90%.

14. The process of claim 1, wherein the tungsten carbide content of the first comminuting tool surface is less than 65%.

15. The process of claim 1, further comprising at a final comminution step which takes place after steps a) and b) being effected with a comminuting tool having surface(s) with a higher tungsten carbide content, with a lower grain size of the tungsten carbide particles than in surface(s) of any comminuting tool used in any preceding comminution steps, or with both a higher tungsten carbide content and a lower grain size as compared with the tungsten carbide content and grain size of any comminuting tool used in any prior comminuting step.

16. The process of claim 1, wherein following comminuting in step a), polycrystalline chunks obtained from step a) are heated to a temperature >500° C. and subsequently quenched in a cold medium prior to further comminuting in step b).

* * * * *